US00RE40964E

(19) United States
(12) Reissued Patent
Suetsugu et al.

(10) Patent Number: US RE40,964 E
(45) Date of Reissued Patent: Nov. 10, 2009

(54) NEGATIVE TYPE RESIST COMPOSITION

(75) Inventors: Masumi Suetsugu, Toyonaka (JP); Takehiro Kusumoto, Osaka (JP); Naoki Takeyama, Saga (JP); Masanori Shinada, Ibaraki (JP)

(73) Assignee: Sumitomo Chemical Company, Limited, Osaka (JP)

(21) Appl. No.: 10/664,355

(22) Filed: Sep. 17, 2003

Related U.S. Patent Documents

Reissue of:
(64) Patent No.: 6,329,119
Issued: Dec. 11, 2001
Appl. No.: 09/559,646
Filed: Apr. 28, 2000

(30) Foreign Application Priority Data

Apr. 30, 1999 (JP) ..... 11-124526
Sep. 8, 1999 (JP) ..... 11-254630

(51) Int. Cl.
*G03F 7/004* (2006.01)
*G03F 7/038* (2006.01)

(52) U.S. Cl. ..... 430/270.1; 430/914; 430/921
(58) Field of Classification Search ..... 430/270.1, 430/914, 921
See application file for complete search history.

(56) References Cited

U.S. PATENT DOCUMENTS 4,371,605 A * 2/1983 Renner ..... 430/280.1
4,439,517 A * 3/1984 Irving ..... 430/328
5,585,218 A * 12/1996 Nakano et al. ..... 430/270.1
5,658,706 A 8/1997 Niki et al.
5,695,910 A * 12/1997 Urano et al. ..... 430/270.1
5,712,078 A * 1/1998 Huang et al. ..... 430/270.1
5,744,281 A * 4/1998 Niki et al. ..... 430/270.1
5,891,601 A * 4/1999 Fukui et al. ..... 430/170
6,858,379 B2 * 2/2005 Zampini et al. ..... 430/325
2004/0146800 A1 * 7/2004 Watanabe et al. ..... 430/160

FOREIGN PATENT DOCUMENTS

EP 0827025 * 3/1998
JP 07-333851 A 12/1995
JP 08-179508 A 7/1996
JP 08-211598 A 8/1996
JP 9166870 * 6/1997
JP 09166870 * 6/1997
JP 10186660 * 7/1998

OTHER PUBLICATIONS

CA 127:154652, JP 09166870 A2, Jun. 1997 CA plusAbstract.*

* cited by examiner

*Primary Examiner*—Amanda C. Walke
(74) *Attorney, Agent, or Firm*—Birch, Stewart, Kolasch & Birch LLP

(57) ABSTRACT

A negative type resist composition is provided, which provides excellent resolution, satisfactory profile and outstanding process stability; is suitable for exposure using deep ultra violet ray; and comprises alkali soluble resin, acid generator, crosslinking agent, and a basic compound represented by the following formula (I)

(I)

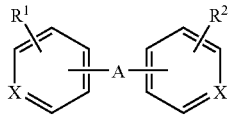

wherein, A represents *sulfide group, disulfide group or* bivalent aliphatic hydrocarbon residue which may be optionally interrupted by imino group, [sulfide group, or disulfide group,] X represents nitrogen atom or $C(NH_2)$, and $R^1$ and $R^2$ independently represent hydrogen or alkyl.

5 Claims, No Drawings

NEGATIVE TYPE RESIST COMPOSITION

Matter enclosed in heavy brackets [ ] appears in the original patent but forms no part of this reissue specification; matter printed in italics indicates the additions made by reissue.

BACKGROUND OF THE INVENTION

The present invention relates to a negative type resist composition which is suitable for lithography process for manufacturing semiconductor integrated circuits using deep ultra violet ray, including eximer laser beam, electron beam, X-rays or radiation, and the like.

In recent years, quarter-micron pattern formations have been demanded with the increase in the integration level of semi-conductor integrated circuits. Particularly, the eximer laser lithography has attracted attention because it enables producing 64 M to 256M DRAM (dynamic random access memory). As a resist suitable for such eximer laser lithography process, a resist utilizing the chemical amplification effects of an acid catalyst, generally called chemical amplification type resist, has been proposed and is putting in the practical use. For example, in the negative working chemical amplification type resist, an acid is generated from an acid generator by the action of high-energy radiation such as electromagnetic waves, and the solubility of a part exposed to a high-energy radiation of an alkali-soluble resin in an alkaline developing solution is reduced by cross-linking and hardening by the action of the generated acid and a cross-linking agent. On the other hand, the acid does not generate in a part that is not exposed to a high-energy radiation and thus the solubility in the alkaline developing solution is maintained. By such a mechanism, a negative working pattern is obtained by a series of treatments, i.e., a formation of a resist film, an irradiation for patterning and an alkaline development The profile of a resist pattern is desirably closer to a rectangle because it has an influence on the accuracy of fine working.

Further, in the lithography using the chemical amplification type resist composition, post exposure bake is generally carried out in order to promote chain reactions using the acid generated by exposure as a catalyst. However, if sensitivity changes caused by fluctuations of post exposure bake temperature is large, the pattern dimension is susceptible to effects of temperature deflection or non-homogeneity of temperature of the bake equipment. Therefore, the sensitivity changes caused by fluctuations of post exposure bake temperature and the pattern dimensional changes at the same exposure amount are desirable to be smaller. However, in the conventional chemical amplification negative type resist, the profile at the pattern top section tended to be rounded and the sensitivity change caused by fluctuations of post exposure bake temperature tended to be large.

In the chemical amplification type resist, it is general practice to add the basic material to prevent deterioration due to inactivation of the acid associated with time passage from exposure to post exposure bake, that is, caused by standing after exposure. Attempts have been made to improve the pattern profile by selecting the basic material in this event. However, adding general basic materials which have been popularly adopted resulted in unsatisfactory effects or degraded the sensitivity or resolution, or caused sensitivity changes due to post exposure bake temperature fluctuations. Therefore, it has been desired to solve these problems.

It Is an object of the present invention to provide a negative type resist composition which has excellent pattern profile, small temperature dependency of the pattern dimensions after exposure, and achieves both excellent sensitivity and resolution. The inventors of the present invention have made extensive researches to achieve the object, and found that excellent performance can be obtained by compounding a specific basic material to the negative type resist composition comprising alkali soluble resin, acid generator, and crosslinking agent. Based on this finding, the present invention was completed.

SUMMARY OF THE INVENTION

The present invention provides a negative type resist composition comprising alkali soluble resin, acid generator, crosslinking agent, and a basic compound represented by the following formula (I)

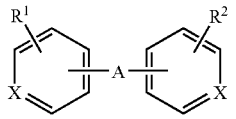

(I)

wherein, A represents *sulfide group, disulfide group or* bivalent aliphatic hydrocarbon residue which may be optionally interrupted by imino group, [sulfide group, or disulfide group,] X represents nitrogen atom or $C(NH_2)$, and $R^1$ and $R^2$ independently represent hydrogen or alkyl.

PREFERRED EMBODIMENT OF THE INVENTION

The composition according to the present invention comprises the basic compound represented by Formula (I) above in addition to alkali soluble resin, acid generator, and crosslinking agent. Only one kind of compounds included in the definition of Formula (I) may be contained or as required, two or more kinds of compounds included in the definition may be used together. By comprising the specific basic compound, effects of improved resolution and better pattern profile have been achieved, as compared to those in which the conventional basic compound is used, and the sensitivity change caused by temperature fluctuations of post exposure bake can be reduced. Furthermore, the basic compound of Formula (I) can exhibit the effective performance as mentioned above at a smaller consumption amount than those which have been conventionally used for the negative type resist.

In Formula (I), A represents *sulfide group, disulfide group or* bivalent aliphatic hydrocarbon residue which may be interrupted by imino group[, sulfide group or disulfide group]. The hydrocarbon residue may be saturated, that is, alkylene, or unsaturated, for example, alkylene. Imino group (—$NH_2$—) may optionally be interposed in the hydrocarbon residue. The imino may exist in plurality in A, but in general, one imino exists. The aliphatic hydrocarbon residue represented by A has a total of 1 to 10 carbons including the case with imino interposed. When A consists of only carbon atom and hydrogen atom, the number of carbons is preferably between 1 and 4. If the number of carbons is 2 or more, they may be either of normal chain or branched, although the linear type, such as linear alkylene or linear alkylene, is preferable. That is, linear alkylene having 2 to 4 carbon atoms, linear alkylene having 2 to 4 carbon atoms and the like are preferable. If A is bivalent aliphatic hydrocarbon residue interrupted with imino, the number of total carbons is preferably between 2 and 6. In this case, too, the group consisting of carbon atom and hydrogen atom existing on both side of imino group may be either of normal chain or branched, if the number of carbons is two or more, respectively. Iminobisalkylene is more preferred as A, and particularly, iminobisalkylene having 2 to 6 carbon atoms is preferred.

A is preferably bivalent aliphatic hydrocarbon residue which may be optionally interrupted by imino group. When this is used, dimensional difference or profile difference tend to be hardly generated between the line and space pattern and isolated pattern.

Specific examples of A include methylene, ethylene, vinylene, trimethylene, tetramethylene, iminobismethylene, sulfide and disulfide.

The linked group A may be positioned at any of 2-position, 3-position, or 4-position on the six-membered ring with respect to X in Formula (I). Preferably, it positioned at 3-position or 4-position of both six-membered rings, respectively. The preferable structure of the compound of the formula (I) is represented by the following Formula (Ia):

(Ia)

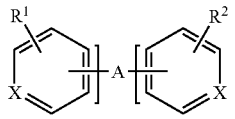

wherein, A, X, $R^1$ and $R^2$ are the same as defined above, and the marks, "]" and "[" indicate that A is positioned on 3-position, or 4-position on the six-membered rings with respect to X.

In Formula (I), $R^1$ and $R^2$, which are the same to or different from each other, are hydrogen or alkyl. The alkyl may have 1 to 6 carbons. If the number of carbons is 3 or more, it may be either normal chain or branched. Furthermore, X represents nitrogen atom or $C(NH_2)$. Therefore, the basic compound represented by Formula (I) may be classified into pyridine derivative represented by the following Formula (Ib) and aniline derivative represented by the following Formula (Ic):

(Ib)

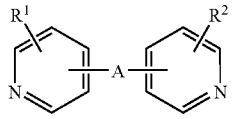

(Ic)

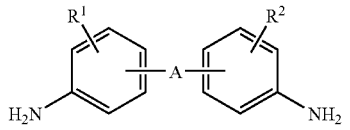

wherein, A, $R^1$ and $R^2$ are the same as defined above.

In Formula (I), X is preferably nitrogen atom. That is, pyridine derivative represented by Formula (Ib) is preferable. Examples of the pyridine derivative that corresponds to Formula (Ib) specifically include 1,2-di(2-pyridyl)ethane, 1,2-di(4-pyridyl)ethane, 1,2-bis(2-methyl-4-pyridyl)ethane, 1,3-di(2-pyridyl)propane, 1,3-di(4-pyridyl)propane, 1,3-bis (2-methyl-4-pyridyl)propane, 1,2-di(2-pyridyl)ethylene, 1,2-di(4-pyridyl)ethylene, bis(2-pyridylmethyl)amine, bis (3-pyridylmethyl)amine, 4,4'-dipyridylsulfide, 4,4'-dipyridyldisulfide and 2,2'-dipyridyldisulfide. Compounds in which 3-position or 4-position of two pyridine rings are linked with the connecting group A, such as 1,2-di(4-pyridyl)ethane, 1,3-di(4-pyridyl)propane, 1,2-di(4-pyridyl) ethylene, bis(3-pyridylmethyl)amine, 4,4'-dipyridylsulfide and 4,4'-dipyridyldisulfide are preferable, because they are able to exhibit the desired effects at a still smaller amount than others. Examples of the aniline-based compound that corresponds to Formula (Ic) specifically include 4,4'-diamino-3,3'-dimethyldlphenylmethane, 4,4'-diamino-3,3'-diethyldiphenylmethane, 4,4'-diaminodiphenylsulfide and 4,4'-diaminodiphenyldisulfide.

The alkali soluble resin, acid generator, and crosslinking agent used in the present invention may be those generally used in this field. Examples of the preferable alkali soluble resins include novolak resins and polyvinyl phenol-based resins. It is possible to use them In combination. The novolak resin referred to here is obtainable by condensing phenol-based compounds and aldehyde under the presence of an acidic catalyst. The polyvinyl phenol-based resin is a polymer obtainable by a polymerization of a vinyl phenol monomer, that is, a compound with the benzene ring connecting to hydroxyl group and vinyl groupused. Specifically, homopolymer of vinyl phenol, copolymer of vinyl phenol and other vinyl compounds such as styrene or (meth) acrylate, in particular, those containing vinyl phenol by more than 50 mol %, and partially hydrogen-added compounds thereof are included in the polyvinyl phenol-based resin. The positions of the hydroxyl group and vinyl group in the vinyl phenol are not particularly limited, but p-vinyl phenol is generally used. When partially hydrogenated compounds of polyvinyl phenol or copolymer of vinyl phenol is used, the ratio of double bonds of benzene rings saturated by hydrogen addition (degree of hydrogenation) is, in general, 50% or less, and preferably 15% or less.

When polyvinyl phenol-based resin is used, those in which the phenolic hydroxyl group Is partially alkyl-etherified is preferable from the viewpoint of sensitivity. In the polyvinyl phenol-based resin in which the phenolic hdyroxyl group partially alkyl-etherified, the alkyl may have 1 to 4 carbons. If the number of carbons is 3 or more, it may be of normal chain of branched. In particular, ethyl, propyl, or isopropyl is preferred for the alkyl. In general, the alkyl-etherified ratio (etherification ratio) of the phenolic hydroxyl group is preferably between 5% and 40%, and particularly preferably between 15% and 25%. Partial-etherification can be achieved by allowing polyvinyl phenol resin to react with halogenated alkyl under basic conditions according to the method mentioned, for example, in "Organic Syntheses Collective Volume 4" by N. Rabjohn, et. al., pp. 836–839, John Wiley & Sons (1963).

The weight-average molecular weight of the polyvinyl phenol-based resin measured by gel permeation chromatography (GPC) using polystyrene as the standard is preferably in a range of about 1,500 and 35,000. The weight-average molecular weight is more particularly about 2,000 to 32000, and further preferably about 2,000 to 25,000, and particularly preferably about 2,000 to 20,000.

When partially alkyl-etherified polyvinyl phenol-based resin is used, the weight-average molecular weight after partial alkyl-etherification within the above-mentioned range is obtained by alkyl-etherifying polyvinyl phenol-based resin of the weight-average molecular weight between about 1,500 and 30,000, slightly lower than the above-mentioned range. The molecular weight distribution of these resins, that is, the ratio of weight-average molecular weight to number average molecular weight measured by GPC is preferably between 1.01 and 2.

Examples of the other alkali soluble resin include polyisopropenyl phenol, copolymers of isopropenyl phenol and other vinyl compounds such as styrene or (meth)acrylate, particularly, those with the ratio of isopropenyl phenol 50 mol % or more. These may be used as alkali soluble resin. It is also possible that these resins may be used In combination with the novolak resin or the polyvinyl phenol-based resin mentioned above.

Examples of the acid generator include iodonium salt compounds, sulfonium salt compounds, organic halogen compounds, particularly haloalkyl-s-triazone compounds, sulfonate compounds, disulfone compounds, diazomethane compounds and N-sulfonyloxyimide compounds. Compounds in this category can be used singly or in admixture of two or more, if necessary. More specifically, compounds listed below can be used as the acid generator:

(1) Iodonium compounds:

diphenyliodoium trifluoromethanesulfonate;

4-methoxyphenylphenyliodonium hexafluoroantiomonate, 4-methoxyphenylphenyliodonium trifluoromethanesulfonate, bis(4-tert-butylphenyl)iodonium tetrafluoroborate, bis(4-tert-butylphenyl)iodonium hexafluorophosphate, bis(4-tert-butylphenyl)iodonium hexafluoroantimonate, bis(4-tert-butylphenyl)iodonium trifluoromethanesulfonate, bis(4-tert-butylphenyl)iodonium 10-camphorsulfonate, bis(4-tert-butylphenyl)iodonium p-toluenesulfonate, and the like (2) Sulfonium salt compounds:

triphenylsulfonium hexaflurophosphate, triphenylsulfonium hexafluoroantiomonate, triphenylsulfonium trifluoromethanesulfonate, 4-methoxyphenyldiphenylsulfonium hexafluoroantimonate, 4-methoxyphenyldiphenylsulfonium trifluoromethanesulfonate, 4-methylphenyldiphenylsulfonium methanesulfonate, p-tolyldiphenylsulfonium trifluoromethanesulfonate, 2,4,6-trimethylphenyldiphenylsulfonium trifluoromethanesulfonate, 4-tert-butylphenyldiphenylsulfonium trifluoromethanesulfonate, 4-phenylthiophenyldiphenylsulfonium hexafluorophosphate, 4-phenylthiophenyldiphenylsulfonium hexafluoroantimonate, 1-(2-naphthoylmethyl)thioranium hexafluoroantimonate, 1-(2-naphthoylmethyl)thioranium trifluoromethanesulfonate, 4-hydroxy-1-naphthyldimethylsulfonium hexafluoroantimonate, 4-hydroxy-1-naphthyldimethylsulfonium trifluoromethanesulfonate, and the like (3) Organic halogen compounds:

2-methyl-4,6-bis(trichloromethyl)-1,3,5-triazine, 2,4,6-tris(trichloromethyl)-1,3,5-triazine, 2-phenyl-4,6-bis(trichloromethyl)-1,3,5-triazine, 2-(4-chlorophenyl)-4,6-bis(trichloromethyl)-1,3,5-triazine, 2-(4-methoxyphenyl)-4,6-bis(trichloromethyl)-1,3,5-triazine, 2-(4-methoxy-1-naphthyl)-4,6-bis(trichloromethyl)-1,3,5-triazine, 2-(benzo[d][1,3]dioxolane-5-yl)-4,6-bis(trichloromethyl)-1,3,5-triazine, 2-(4-methoxystyryl)-4,6-bis(trichloromethyl)-1,3,5-triazine, 2-(3,4,5-trimethoxystyryl)-4,6-bis(trichloromethyl)-1,3,5-triazine, 2-(3,4-dimethoxystyryl)-4,6-bis(trichloromethyl)-1,3,5-triazine, 2-(2,4-dimethoxystyryl)-4,6-bis(trichloromethyl)-1,3,5-triazine, 2-(2-methoxystyryl)-4,6-bis(trichloromethyl)-1,3,5-triazine, 2-(4-butoxystyryl)-4,6-bis(trichloromethyl)-1,3,5-triazine, 2-(4-pentyloxystyryl)-4,6-bis(trichloromethyl)-1,3,5-triazine, and the like (4) Sulfonate compounds:

1-benzoyl-1-phenylmethyl p-toluenesulfonate (common name: benzoin tosilate), 2-benzoyl-2-hydroxy-2-phenylethyl p-toluenesulfonate (common name: α-methylolbenzoin tosilate), 1,2,3-benzenetriyl trismethanesulfonate, 2,6-dinitrobenzyl p-toluenesulfonate, 2-nitrobenzyl p-toluenesulfonate, 4-nitrobenzyl p-toluenesulfonate, and the like.

(5) Disulfone compounds:

diphenyl disulfone, di-p-tolyl disulfone, and the like.

(6) Diazomethane compounds:

bis(phenylsulfonyl)diazomethane, bis(4-chlorophenylsulfonyl)diazomethane, bis(p-tolylsulfonyl)diazomethane, bis(4-tert-butylphenylsulfonyl)diazomethane, bis(2,4-xylylsulfonyl)diazomethane, bis(cyclohexylsulfonyl)diazomethane, bis(tert-butylsulfonyl)diazomethane, (benzoyl)(phenylsulfonyl)diazomethane, and the like.

(7) N-sulfonyloxyimide compounds:

N-(ethylsulfonyloxy)succinimide,

N-(isopropylsulfonyloxy)succinimide,

N-(butylsulfonyloxy)succinimide,

N-(10-camphorsulfonyloxy)succinimide,

N-(phenylsulfonyloxy)succinimide,

N-(trifluoromethylsulfonyloxy)succinimide,

N-(trifluoromethylsulfonyloxy)phthalimide,

N-(trifluoromethylsulfonyloxy)-5-norbornene-2,3-dicarboxylmide,

N-(trifluoromethylsulfonyloxy)naphthalimide,

N-(10-camphorsulfonyloxy)naphthalimide, and the like.

In particular, when the light of wavelength less than 300 nm, electron beams, X-rays and the like are used for exposure light sources, sulfonic ester of N-hydroxyimide compounds, that is, N-sulfonyloxylmide compounds is preferably used for the acid generator. Examples of particularly preferable acid generator include N-(ethylsulfonyloxy)succinimide, N-(isopropylsulfonyloxy)succinimide, N-(butylsulfonyloxy) succinimide and N-(10-camphorsulfonyloxy)succinimide.

The cross-linking agent used in the present invention may be any compounds which have an action of cross-linking the above-mentioned alkali-soluble resin by the action of an acid generated from the acid generator. The kind of the cross-linking agent is not limited but compounds having a methylol group or alkyl ethers thereof are preferred as the cross-linking agent. One kind of the cross-linking agent may be used singly, or two or more kinds may be used in combination. Examples the compound having a methylol group or alkyl ethers thereof include compounds disclosed in JP-A-1-293339 and JP-A-5-210239. Among them, preferred cross-linking agents are hexamethoxymethylmelamine of the following formula (h) tetramethoxymethylbenzoguanamine of the following formula (i), tetramethoxymethylglyoxaldiureine of the following formula (j), and the like.

(II)

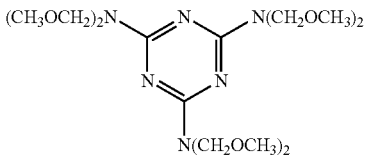

(III)

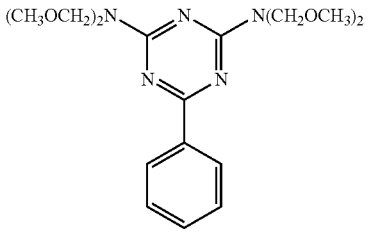

(IV)

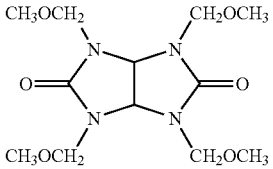

The preferable composition ratio of each component in the negative type resist composition according to the present invention is the alkali soluble resin between 50 and 95 wt %. the acid generator between 0.1 and 25 wt %, the crosslinking agent between 1 and 30 wt %, and the basic compound of Formula (I) between 0.02 and 1 wt %, and more preferably between 0.04 and 0.5 wt %, based on the total solid content in the composition. The excessively small content of the basic compound results in unsatisfactory effects, and the excessively large content results in lowered sensitivity and increases dimensional difference between line-and-space pattern and isolated pattern. Of the basic compounds of Formula (I), particularly, the pyridine derivative represented by Formula (Ib) exhibit satisfactory effects at such a small amount as 0.5 wt % or less. The negative type resist composition according to the present invention may comprise various additives generally used in this field, such as, sensitizer, surfactant, stabilizer, dye, adhesion improver, etc. as required.

The resist composition is usually prepared by mixing respective components described above with a solvent to from a resist solution so that the total solid content therein is 10 to 50% by weight. The resist solution is coated onto a substrate such as a silicon. The solvent used herein may be anyone that can dissolve the components and has an appropriate drying rate. Such a solvent can be one usually used in this field. Examples thereof include glycol ether esters such as ethyl cellosolve acetate, methyl cellosolve acetate, propylene glycol monomethyl ether acetate and propylene glycol monoethyl ether acetate; glycol mono- or di-ethers such as ethyl cellosolve, methyl cellosolve, propylene glycol monomethyl ether, propylene glycol monoethyl ether and diethylene glycol dimethyl ether: esters such as ethyl lactate, butyl acetate and ethyl: ketones such as 2-heptanone, cyclohexanone and methyl isobutyl ketone; aromatic hydrocarbons such as xylene; and lactams such as N-methyl-2-pyrrolidone. These solvents may be used singly or as a mixture of two or more.

The resist composition of the present Invention can be used, for example, in the following manner: A resist solution obtained by dissolving components into a solvent as described above is coated on a substrate according to an usual manner such as spin coating. The coated substrate is dried (pre-baked) and subjected to exposure for patterning. Then, it is subjected to heat treatment (post-exposure bake) for promoting chemical reaction and then developed with an alkaline developer to form a negative resist pattern, wherein the exposed part remains and the non-exposed part is removed. The alkaline developer used here may be anyone, used in this field. Examples thereof include 1 to 10% by weight aqueous solution of tetramethyl ammonium hydroxide or (2-hydroxyethyl)trimethyl ammonium hydroxide (common name: choline). A water-soluble organic solvent such as methanol or ethanol and a surfactant of a certain kind can be added to the aqueous alkali solution in an appropriate amount.

The present invention will now be described in more detail based on Examples, which by no means should be construed as a limitation upon the scope of the present invention. In Examples, parts are weight based unless otherwise specified.

REFERENCE EXAMPLE 1

Production of poly[p-hydroxystyrene/p-{1-(2-oxo-1-pyrrolidinyl)ethoxy}styrene]

Into a reaction vessel, were charged 21.0 parts of poly(p-vinylphenol) ["VP-2500", manufactured by Nippon Soda, having a weight average molecular weight of 4,000 and a distribution of 1.14], and 84 parts of acetone, and they were stirred to make a solution. To this solution were charged 12.7 parts of unhydrous potassium carbonate and 8.2 parts of ethyl iodide, and the temperature was elevated so that the mixture reached the reflux state. Then the solution was kept at the reflux state for 15 hours. After adding methyl isobutyl ketone, the organic layer was washed with an aqueous oxalic acid solution, then washed with ion-exchanged water. The organic layer after washing was concentrated to 44 parts, combined with 130 parts of propylene glycol monomethyl ether acetate and further concentrated to 63 parts. The solid content of the concentrate measured by weight-loss on heating was 34.19% by weight. By $^{1}$H-NMR measurement, it was confirmed that the resin was a copolymer in which 28.8% of hydroxyl groups in poly(p-vinylphenol) was ethyl-etherified. The resin was referred to as EPVP1.

REFERENCE EXAMPLE 2

The procedure in Reference Example 1 was repeated except that the amount of anhydrous potassium carbonate was 15.5 parts and that of ethyl iodide was 10.9 parts. The concentration of the organic layer after washing with ion-exchanged water was carried out to attain 45 parts, and the concentration after adding propylene glycol monomethyl ether acetate was carried out to attain 68 parts. As the result, a solution in which the solid content of the concentrate measured by weight-loss on heating was 27.45% by weight was obtained. By $^{1}$H-NMR measurement, it was confirmed that the resin was a copolymer In which 37.8% of hydroxyl groups in poly(p-vinylphenol) was ethyletherified. The resin was referred to as EPVP2.

REFERENCE EXAMPLE 3

Into a reaction vessel were charged 30.0 parts of the same poly(p-vinylphenol) as that used in Reference example 1 and 120 parts of acetone. They were stirred to form a solution. Additionally charged were 29.6 parts of anhydrous potassium carbonate and 18.2 parts of isopropyl iodide. The temperature was elevated to reach the reflux state. Subsequently, the reflux state was kept for 27 hours. After adding methyl isobutyl ketone, the solution was washed with an aqueous oxalic acid solution, then washed with ion-exchanged water. The organic layer after washing was concentrated to 71 parts, combined with 206 parts of propylene glycol monomethyl ether acetate and further concentrated to 88.6 parts. The solid content of the concentrate measured by weight-loss on heating was 31.92% by weight. By $^{1}$H-NMR measurement, it was confirmed that the resin after reaction was a copolymer in which 31.4% of hydroxyl groups in poly(p-vinylphenol) was converted to isopropyl ether. The resin was referred to as Resin PrPVP.

EXAMPLES 1 TO 6 AND COMPARATIVE EXAMPLES 1 TO 2

The components shown below were mixed to make a solution. The solution was filtered through a filter of fluorine resin having a pore size of 0.1 μm to give resist solutions.

| | |
|---|---|
| Alkali soluble resin: | |
| Resin EPVP1 (solid content) | 12 parts |
| Resin EPVP2 (solid content) | 46 parts |
| Poly(p-vinylphenol)* | 42 parts |
| Acid generator: | |
| N-(isopropylsulfonyloxy)succinimide | 11.0 parts |
| Crosslinking agent: Hexamethoxymethylmelamine | 5.0 parts |
| Basic compound: The kind and amount are shown in Table 1 | |
| Solvent: | |
| Propylene glycol monomethyl ether acetate | 575 parts** |

*"VP-2500" commercially available from Nippon Soda, same as that used in the reference example.
**The solvent amount includes carry-over from the resin solution.

The resist solution obtained above was coated on a silicon wafer with a spin coater. Then the silicon wafer was pre-baked on a hotplate at 100° C. for 60 seconds so that a resist film having a thickness of 0.70 μm is formed. The film after pre-baking was irradiated with a KrF excimer laser stepper ["NSR-2205 EX12B", manufactured by Nikon, NA=0.55] having an exposure wavelength of 248 nm through a chromium mask having a line-and-space pattern or an isolated pattern of one of various dimensions, changing stepwise the exposure amount. In the isolated pattern, the part for exposure has small round shape and the surrounding parts are masked. After the exposure, the exposed wafer was heated on a hot plate at 105° C. or 100° C. for 60 seconds (post-exposure baking). Then the wafer was developed with 2.38% aqueous tetramethyl ammonium hydroxide solution to give a negative pattern.

The obtained pattern was assessed by an electron microscope and the effective sensitivity, resolution, profile and temperature dependency were measured according to the following manner.

Effective sensitivity: Expressed by the minimum exposure amount that enables the cross-sectional width of 0.30 μm line and space pattern to be developed at 1:1 when post exposure bake is carried out at 105° C.

Resolution: Expressed by the minimum line-and-space width wherein the pattern is separated without film reduction when the resist is developed at the exposure amount of the effective sensitivity.

Profile: Expressed with ○ when the line-and-space pattern cross section after development is nearly rectangle and χ when the top is round or the cross section is inversely tapered.

Temperature dependency: The line section width of 0.30-μm line-and-space pattern is measured when the resist is exposed at the exposure amount of effective sensitivity and post exposure bake is carried out at 105° C. and that at 100° C. is also measured. Based on the widths at 105° C. and at 100° C., dimensional changes per 1° C. are found.

Symbols shown in the column of "basic compounds" in Table 1 represent the following compounds, respectively.

A: 1,3-di(4-pyridyl)propane
B. 1,2-di(4-pyridyl)ethylene
C: bis(3-pyridylmethyl)amine
D: bis(2-pyridylmethyl)amine
E: 4,4'-diamino-3,3'-diethyldiphenylmethane
F: 4,4'-dipyridyl sulfide
X: 4-butoxy aniline
Y: trioctylamine

TABLE 1

| No. | basic compounds Kind/ Amount [Parts] | Effective sensitivity [mJ/cm2] | Resolution [μm] | Profile | Temperature dependency [nm/° C.] |
|---|---|---|---|---|---|
| Example | | | | | |
| 1 | A/0.1 | 82 | 0.20 | ○ | 8 |
| 2 | B/0.09 | 54 | 0.21 | ○ | 8 |
| 3 | C/0.2 | 102 | 0.22 | ○ | 2 |
| 4 | D/0.5 | 66 | 0.22 | ○ | 13 |
| 5 | E/0.7 | 89 | 0.22 | ○ | 13 |
| 6 | F/0.28 | 98 | 0.23 | ○ | 8 |
| Comparative Example | | | | | |
| 1 | X/0.4 | 42 | 0.28 | x | >40 |
| 2 | Y/1.3 | 10 | 0.24 | x | 32 |

EXAMPLE 7

The components shown below were mixed to make a solution. The solution was filtered through a filter of fluorine resin having a pore size of 0.1 μm to give resist solutions

| | |
|---|---|
| Alkali soluble resin: | |
| Resin PrPVP (solid content) | 69 parts |
| Poly(p-vinylphenol)* | 31 parts |
| Acid generator: | |
| N-(isopropylsulfonyloxy)succinimide | 11.0 parts |
| Crosslinking agent: Hexamethoxymethylmelamine | 5.0 parts |
| Basic compound: 1,2-di(4-pyridyl)ethane | 0.1 parts |

-continued

| | |
|---|---|
| Solvent: | |
| Propylene glycol monomethyl ether acetate | 575 parts** |

*"VP-2500" commercially available from Nippon Soda, same as that used in the reference example.
**The solvent amount includes carry-over from the resin solution.

Using this resist solution, a resist film having thickness of 0.56 μm was formed according to the same manner as in Example 1. Thereafter, the same procedures as those in Example 1 were repeated except that the KrF eximer stepper was changed to "NSR-2205 EX12B" (NA=0.55) produced by Nikkon to obtain negative type patterns. The patterns obtained were assessed according to the same manners as those in Example 1, provided that the effective sensitivity was expressed by the minimum exposure amount that enables the cross sectional width of 0.25 μm line and space pattern size to be developed at 1: 1, and, for the temperature dependency, the line section width of the 0.25 μm line-and-space pattern is measured, based on which the dimensional changes per 1° C. were obtained. The results are shown in Table 2.

EXAMPLE 8

The components shown below were mixed to make a solution. The solution was filtered through a filter or fluorine resin having a pore size of 0.1 μm to give resist solutions. Using this resist solution, assessments were carried out according to the same manners as in Example 7 The results are shown in Table 2.

| | |
|---|---|
| Alkali soluble resin: | |
| P-vinylphenol/styrene copolymer (Copolymerization ratio by mole: 70/30 Weight average molecular weight: 3,400. Distribution: 1.14) | 20 parts |
| P-vinylphenol/styrene copolymer (Copolymerization ratio by mole: 85/15 Weight average molecular weight: 3,100. Distribution: 1.06) | 80 parts |
| Acid generator: | |
| N-(butylsulfonyloxy)succinimide | 11.0 parts |
| Crosslinking agent: Hexamethoxymethylmelamine | 5.0 parts |
| Basic compound: 1,3-di(4-pyridyl)propane | 0.1 parts |
| Solvent: | |
| Propylene glycol monomethyl ether acetate | 575 parts** |

EXAMPLE 9

The components shown below were mixed to make a solution. The solution was filtered through a filter of fluorine resin having a pore size of 0.1 μm to give resist solutions. Using this resist solution, assessments were carried out according to the same manners as in Example 7. The results are shown in Table 2.

| | |
|---|---|
| Alkali soluble resin: | |
| Resin PrPVP (solid content) | 70 parts |
| Poly(p-vinylphenol)* | 30 parts |

-continued

| | |
|---|---|
| Acid generator: | |
| N-(isopropylsulfonyloxy)succinimide | 11.0 parts |
| Crosslinking agent: Hexamethoxymethylmelamine | 5.0 parts |
| Basic compound: 4,4-dipyridylsulfide | 0.125 parts |
| Solvent: | |
| Propylene glycol monomethyl ether acetate | 625 parts** |

*"VP-2500" commercially available from Nippon Soda, same as that used in the reference example.
**The solvent amount includes carry-over from the resin solution.

EXAMPLE 10

The same manners as in Example 8 were repeated except that 0.0625 part of 4,4-dipyridylsulfide and 0.0625 part of 1,3-di(4-pyridyl)propane were used in combination as the basic compound to give a resist solution. Using this resist solution, assessments were carried out according to the same manners as in Example 7. The results are shown in Table 2.

COMPARATIVE EXAMPLE 3

The components shown below were mixed to make a solution. The solution was filtered through a filter of fluorine resin having a pore size of 0.1 μm to give resist solutions. Using this resist solution, assessments were carried out according to the same manners as in Example 7. The results are shown in Table 2.

| | |
|---|---|
| Alkali soluble resin: | |
| Resin EPVP1 (solid content) | 53 parts |
| Resin EPVP2 (solid content) | 5 parts |
| Poly(p-vinylphenol) | 42 parts |
| Acid generator: | |
| N-(isopropylsulfonyloxy)succinimide | 11.0 parts |
| Crosslinking agent: Hexamethoxymethylmelamine | 5.0 parts |
| Basic compound: tri-n-butylamine | 1.0 part |
| Solvent: | |
| Propylene glycol monomethyl ether acetate | 625 parts** |

*"VP-2500" commercially available from Nippon Soda, same as that used in the reference example.
**The solvent amount includes carry-over from the resin solution.

COMPARATIVE EXAMPLE 4

The components shown below were mixed to make a solution. The solution was filtered through a filter of fluorine resin having a pore size of 0.1 μm to give resist solutions. Using this resist solution, assessments were carried out according to the same manners as in Example 7. The results are shown in Table 2.

| | |
|---|---|
| Alkali soluble resin: | |
| Resin EPVP1 (solid content) | 53 parts |
| Resin EPVP2 (solid content) | 5 parts |
| Poly(p-vinylphenol)* | 42 parts |
| Acid generator: | |
| N-(isopropylsulfonyloxy)succinimide | 11.0 parts |
| Crosslinking agent: Hexamethoxymethylmelamine | 5.0 parts |

-continued

| | |
|---|---|
| Basic compound: N,N'diethylaniline | 1.0 part |
| Solvent: | |
| Propylene glycol monomethyl ether acetate | 625 parts** |

*"VP-2500" commercially available from Nippon Soda, same as that used in the reference example.
**The solvent amount includes carry-over from the resin solution.

TABLE 2

| No. | Effective sensitivity [mJ/cm2] | Resolution [μm] | Profile | Temperature dependency [nm/° C.] |
|---|---|---|---|---|
| Example | | | | |
| 7 | 31 | 0.16 | ○ | 8 |
| 8 | 33 | 0.16 | ○ | 15 |
| 9 | 20 | 0.17 | ○ | 15 |
| 10 | 25 | 0.16 | ○ | 9 |
| Comparative Example | | | | |
| 3 | 6 | 0.18 | x | >50 |
| 4 | 9 | 0.17 | x | >50 |

The resist composition according to the present invention provides excellent resolution and satisfactory profile, and because of small dependency on post exposure bake temperature, it provides outstanding process stability. The composition is suitable for exposure using deep ultra violet ray, including eximer laser beam, X-rays, electron beam, ion beam and the like, and can improve the resolution and contrast in lithography using above-mentioned light sources. As a result, the resist composition according to the present invention is able to form fine patterns at high accuracy.

What is claimed is:

1. A negative type resist composition comprising [alkali soluble resin,] *polyvinyl phenol-based resin in which the phenolic hydroxyl group is partially alkyl-etherified,* acid generator, crosslinking agent, and a basic compound represented by the following formula (I)

(I)

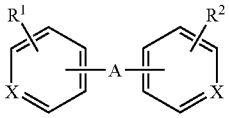

wherein, A represents [bivalent aliphatic hydrocarbon residue which may be optionally interrupted by imino group, sulfide group, or disulfide group] *a sulfide group or disulfide group*, X represents *a* nitrogen atom [or $C(NH_2)$], and $R^1$ and $R^2$ independently represent hydrogen or alkyl [provided that, when X represents $C(NH_2)$, A represents sulfide group or disulfide group].

2. The negative type resist composition according to claim 1, wherein the basic compound of the formula (I) is represented by the following formula (Ia):

(Ia)

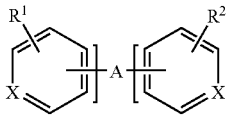

wherein, A, X, $R^1$ and $R^2$ are the same as defined in claim 1, and the marks, "}" and "{", indicate that A is positioned on 3-position, or 4-position on the six-membered rings with respect to X.

[3. The negative type resist composition according to claim 1, wherein the basic compound of the formula (I) is represented by the following formula (Ib):

(Ib)

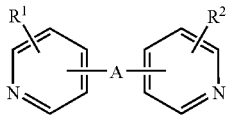

wherein, A, $R^1$ and $R^2$ are the same as defined in claim 1.]

[4. The negative type resist composition according to claim 3, wherein A is a linear alkylene having 2 to 4 carbon atoms, linear alkylene having 2 to 4 carbon atoms or iminobisalkylene having 2 to 6 carbon atoms.]

[5. The negative type resist composition according to claim 4, wherein the basic compound of formula (Ib) is selected from 1,2-di(4-pyridyl)ethane, 1,3-di(4-pyridyl) propane, 1,2-di(4-pyridyl)ethylene and bis(3-pyridylmethyl) amine.]

[6. The negative type resist composition according to claim 3, wherein A is a sulfide group or a dilsufide group.]

7. The negative type resist composition according to claim [6] *1*, wherein the basic compound of formula [(Ib)] *(I)* is selected from 4,4'-dipyridylsulfide and 4,4'-dipyridyldisulfide.

[8. The negative type resist composition according to claim 1, wherein the alkali soluble resin is a polyvinyl phenol-based resin.]

9. The negative type resist composition according to claim 1, wherein the acid generator [Is] *is* a sulfonic ester of N-hydroxyimide compound.

10. The negative type resist composition according to claim 1, *2, 7, or 9,* wherein composition ratio of the basic compound of formula (I) is between 0.02 and 1 wt %, based on the total solid content in the composition.

[11. The negative type resist composition according to claim 1, wherein A is a linear alkylene having 2 to 4 carbon atoms, linear alkylene having 2 to 4 carbon atoms or iminobisalkylene having 2 to 6 carbon atoms.]

[12. The negative type resist composition according to claim 1, wherein A is a sulfide group or a disulfide group.]

[13. The negative type resist composition according to claim 1, wherein A is selected from the group consisting of methylene, ethylene, vinylene, trimethylene, tetramethylene, iminobismethylene, sulfide and disulfide.]

* * * * *